(12) United States Patent
Ovshinsky et al.

(10) Patent No.: US 7,085,155 B2
(45) Date of Patent: Aug. 1, 2006

(54) SECURED PHASE-CHANGE DEVICES

(75) Inventors: Stanford R. Ovshinsky, Bloomfield Hills, MI (US); Morrel H. Cohen, Bridgewater, NJ (US)

(73) Assignee: Energy Conversion Devices, Inc., Rochester Hills, MI (US)

( * ) Notice: Subject to any disclaimer, the term of this patent is extended or adjusted under 35 U.S.C. 154(b) by 66 days.

(21) Appl. No.: 10/775,431

(22) Filed: Feb. 10, 2004

(65) Prior Publication Data

US 2004/0179394 A1 Sep. 16, 2004

Related U.S. Application Data

(63) Continuation-in-part of application No. 10/761,022, filed on Jan. 20, 2004, which is a continuation-in-part of application No. 10/657,285, filed on Sep. 8, 2003, which is a continuation-in-part of application No. 10/426,321, filed on Apr. 30, 2003, now Pat. No. 6,969,867, which is a continuation-in-part of application No. 10/384,994, filed on Mar. 10, 2003, now Pat. No. 6,967,344.

(51) Int. Cl.
*G11C 11/00* (2006.01)

(52) U.S. Cl. ...................... 365/163; 257/2; 365/185.04
(58) Field of Classification Search ................ 365/163; 257/2
See application file for complete search history.

(56) References Cited

U.S. PATENT DOCUMENTS

| | | | |
|---|---|---|---|
| 3,876,985 A * | 4/1975 | Fritzsche et al. ............... | 297/2 |
| 5,166,758 A | 11/1992 | Ovshinsky | |
| 5,296,716 A | 3/1994 | Ovshinsky | |
| 5,388,096 A * | 2/1995 | Westberg .................... | 370/375 |
| 5,414,271 A | 5/1995 | Ovshinsky | |
| 5,523,970 A * | 6/1996 | Riggio, Jr. ............. | 365/185.01 |
| 5,534,711 A | 7/1996 | Ovshinsky | |
| 5,536,947 A | 7/1996 | Klersy | |
| 5,543,737 A | 8/1996 | Ovshinsky | |
| 5,596,522 A | 1/1997 | Ovshinsky | |
| 5,694,146 A | 12/1997 | Ovshinsky | |
| 5,714,768 A | 2/1998 | Ovshinsky | |
| 5,757,446 A | 5/1998 | Ovshinsky | |
| 5,825,046 A * | 10/1998 | Czubatyj et al. ............... | 257/2 |
| 5,912,839 A | 6/1999 | Ovshinsky et al. | |
| 6,087,674 A | 7/2000 | Ovshinsky | |
| 6,141,241 A | 10/2000 | Ovshinsky et al. | |
| 6,545,903 B1 * | 4/2003 | Wu ............................ | 365/148 |

(Continued)

*Primary Examiner*—Anh Phung
*Assistant Examiner*—Eric J. Wendler
(74) *Attorney, Agent, or Firm*—Kevin L. Bray; Marvin S. Siskind

(57) ABSTRACT

An electronic device for securing the contents of data storage and processing elements. The device includes a security element and a phase-change element connected in a parallel arrangement. The security element is a three-terminal device, having an ON state and an OFF state which differ in resistance and regulate electronic access to the phase-change element by controlling the flow of electrical current applied to the parallel combination. In the ON state, the resistance of the security element is less than that of the phase-change element, thereby precluding a determination of the resistance of the phase-change element. In this PROTECT mode, the contents of the phase-change element are secured. In the OFF state, the resistance of the security element is greater than that of the phase-change material so that the resistance of the parallel combination approaches that of the phase-change element. In this READ mode, the resistance and information content of the phase-change element can be determined.

29 Claims, 2 Drawing Sheets

U.S. PATENT DOCUMENTS

| | | | |
|---|---|---|---|
| 6,570,784 B1 * | 5/2003 | Lowrey | 365/163 |
| 6,671,710 B1 | 12/2003 | Ovshinsky | |
| 6,714,954 B1 | 3/2004 | Ovshinsky | |
| 6,813,177 B1 * | 11/2004 | Lowrey et al. | 365/148 |
| 6,816,404 B1 * | 11/2004 | Khouri et al. | 365/163 |
| 6,820,203 B1 * | 11/2004 | Okaue et al. | 713/193 |
| 6,862,214 B1 * | 3/2005 | Lee et al. | 365/163 |
| 6,944,050 B1 * | 9/2005 | Kang et al. | 365/158 |
| 6,967,344 B1 | 11/2005 | Ovshinsky | |
| 6,969,867 B1 | 11/2005 | Ovshinsky | |
| 6,999,953 B1 | 2/2006 | Ovhsinsky | |
| 2004/0178402 A1 | 9/2004 | Ovshinsky | |
| 2004/0178404 A1 | 9/2004 | Ovshinsky | |
| 2005/0270832 A1 * | 12/2005 | Chu et al. | 365/163 |
| 2006/0077737 A1 * | 4/2006 | Ooishi | 365/203 |
| 2006/0097240 A1 * | 5/2006 | Lowrey et al. | 257/5 |

* cited by examiner

SECURED PHASE-CHANGE DEVICES

RELATED APPLICATION INFORMATION

This application is a continuation-in-part of U.S. patent application Ser. No. 10/761,022 filed on Jan. 20, 2004 and entitled "Multi-Terminal Devices having Logic Functionality", which is a continuation in part of U.S. patent application Ser. No. 10/657,285 filed on Sep. 8, 2003 and entitled "Multiple Bit Chalcogenide Storage Device", which is a continuation-in-part of application Ser. No. 10/426,321, filed Apr. 30, 2003, now U.S. Pat. No. 6,969,867, entitled "Field Effect Chalcogenide Devices", which is a continuation-in-part of application Ser. No. 10/384,994, filed Mar. 10, 2003, now U.S. Pat. No. 6,967,344, entitled "Multi-Terminal Chalcogenide Switching Devices", the disclosures of which are hereby incorporated by reference herein.

FIELD OF INVENTION

This invention pertains to electronic devices that regulate access to the contents of data storage and processing elements for the purpose of securing information content. More particularly, this invention relates to a parallel circuit combination that includes a three-terminal security element and a phase-change element where the security element has an ON state for protecting the phase-change element and an OFF state that permits a reading of the phase-change element.

BACKGROUND OF THE INVENTION

There is a continuing need to improve the performance of computers to meet the requirements of new and more sophisticated computing applications. Applications such as pattern association, pattern classification, associative memory functions, speech, and character recognition remain largely unamenable to solution or implementation by current computers, including many tasks that are readily and intuitively performed by humans and other biological organisms.

The desire to expand the frontiers of computer science has prompted consideration of the factors that contribute to the limitations of current computers. Silicon is at the heart of today's computer. The advances in computing power and speed over the years have largely been a consequence of understanding better the fundamental properties of silicon and harnessing those properties for practical effect. Initial progress was predicated on building basic electronic components such as transistors and diodes out of silicon, and later progress followed from the development of integrated circuits. More recent advances represent a continuation of these trends and currently emphasize miniaturization and the integration of an ever larger number of microelectronic devices on a single chip. Smaller devices lead to higher memory storage densities, more highly integrated circuits and reduced interaction times between devices on the same chip.

Since future improvements in computing power and functionality are currently predicated on further improvements in silicon technology, there has been much recent discussion about the prognosis for continued miniaturization of silicon-based electronic devices. A growing consensus is emerging that the computer industry is rapidly approaching the performance limits of silicon. The feature size in today's manufacturing technologies is 0.18 micron, and this is now being reduced to about 0.10 micron. Further decreases in feature size, however, are deemed problematic because sizes below about 0.10 micron lead to a change in the fundamental behavior of silicon. More specifically, as the dimensions of silicon devices decrease to tens of nanometers and below, silicon enters the quantum regime of behavior and no longer functions according to the classical physics that governs macroscopic objects. In the quantum regime, energy states are quantized rather than continuous and phenomena such as tunneling lead to delocalization of electrons across many devices. Consequences of tunneling include leakage of current as electrons escape from one device to neighboring devices and a loss of independence of devices as the state of one device influences the state of neighboring devices. Such leakage can occur within a single device as well. In addition to fundamental changes in the behavior of silicon, further decreases in the dimensions of silicon devices also pose formidable technological challenges. New and costly innovations in fabrication methods such as photolithography will be needed to achieve smaller feature sizes.

One strategy for advancing the capabilities of computers is to identify materials other than silicon that can be used as the active medium in data processing and/or storage applications. Such alternative computing media could be used independent of or in combination with silicon to form the basis of a new computing industry that seeks to offer better performance, more convenient manufacturing and better economics than would be possible with silicon.

One of the instant inventors, S. R. Ovshinsky, has recently proposed new uses of chalcogenide phase-change materials as active materials for the processing and storage of data. In U.S. Pat. No. 6,671,710 (the '710 patent), the disclosure of which is hereby incorporated by reference herein, Ovshinsky et al. describe a principle of operation of phase-change materials in conventional and cognitive computing applications. Phase-change materials can not only operate in the binary mode characteristic of conventional silicon computers, but also offer opportunities for the non-binary storage and processing of data. Non-binary storage provides for high information-storage densities, while non-binary processing provides for increased parallelism of operation. The '710 patent also describes representative algorithms that utilize a non-binary computing medium for mathematical operations such as addition, subtraction, multiplication and division. U.S. Pat. No. 6,714,954 (the '954 patent) by Ovshinsky et al., the disclosure of which is hereby incorporated by reference herein, describes further mathematical operations based on a phase-change computing medium, including factoring, modular arithmetic and parallel operation.

In U.S. Pat. No. 6,999,953 (the '953 patent), the disclosure of which is hereby incorporated by reference herein, Ovshinsky considers the architecture of computing systems based on devices utilizing a phase-change material as the active computing medium. More specifically, Ovshinsky considers networks of phase-change computing devices and demonstrates functionality that closely parallels that of biological neural networks. Important features of this functionality include the accumulative response of phase-change computing devices to input signals from a variety of sources, an ability to weight the input signals and a stable, reproducible material transformation that mimics the firing of a biological neuron. This functionality enables a new concept in intelligent computing that features learning, adaptability, and plasticity.

In U.S. Pat. No. 9,967,433 ('344 patent) and U.S. Pat. No. 6,969,867 ('867 patent) and U.S. patent application Ser. No. 10/657,285 (the '285 application), and Ser. No. 10/761,022 (the '022 application), the disclosures of which are hereby incorporated by reference herein, Ovshinsky et al. further develop the notion of phase-change computing by discussing additional computing and storage devices. The '344 patent discusses a multi-terminal phase-change device where a control signal provided at one electrical terminal modulates the current, threshold voltage or signal transmitted between other electrical terminals through the injection of charge carriers. The '867 patent describes a related multi-terminal device that utilizes a field effect terminal to modulate the current, threshold voltage or signal transmitted between other terminals. The devices described in the '344 and '867 patents may be configured to provide a functionality analogous to that of the transistor that is so vital to silicon based computers. The '285 application presents multiple-bit storage devices having multiple terminals that utilizes a phase-change material. The '022 application describes multi-terminal logic devices that utilize a phase-change material.

The foregoing work by Ovshinsky et al. provides concepts, operating principles and some basic devices to enable a computing paradigm based in whole or in part on chalcogenide or other phase-change materials. In order to further the realization of chalcogenide computing as a viable complement or alternative to silicon-based technologies, it is desirable to expand the range of devices and functionality available from chalcogenide and other phase-change materials. Of greatest interest are devices and systems capable of performing processing, storage or memory, and logic functions. Further considerations include encryption and secure data storage.

SUMMARY OF THE INVENTION

The instant invention provides secured storage and processing devices. In one embodiment, the secured devices include a security element and a register for the storage or processing of data. The register includes a phase-change material and may be used for data storage, conventional computing or cognitive computing. The security element is a three-terminal element that can regulate access to the contents of the register. The security element can be configured to an OFF state to permit reading of the register or to an ON state to prevent the reading of the register. The security element and register are connected as a parallel combination in the instant secured device. The device resistance is controlled by the resistance of the parallel combination, which in turn is governed by the relative resistances of the security element and register. In the OFF state, the security element has a higher resistance than the register, and the measured resistance of the secured device corresponds closely to the resistance of the register, thereby providing information about the state of the register. In the ON state, the security element has a lower resistance than the register, and the measured resistance of the device corresponds more closely to the resistance of the security element, thereby preventing or inhibiting a determination of the resistance of the register. The security element thus provides a degree of security for the contents of the register above and beyond that intrinsically possessed by the register.

In another embodiment, the secured device includes a parallel combination of a security element and a weighting device. The weighting device includes a phase-change material whose resistance is continuously variable over a range of resistances. The weighting device is useful in the processing of information and may be used to modulate the transmission of signals between devices in a network through the control of its resistance. In the OFF state, the security element has a higher resistance than the weighting device, thereby enabling a reading of the resistance or alteration of the resistance state of the weighting device. In the ON state, the security element has a lower resistance than the weighting device, thereby preventing or inhibiting a reading or alteration of the resistance state of the weighting device. The weighting device may be separately secured by the security element or may be secured in combination with a register.

DETAILED DESCRIPTION OF THE ILLUSTRATED EMBODIMENTS

The instant invention provides a device that enhances the security of information or data stored or processed by a register or weighting device. As used herein, a register is a computing element that contains or processes data or information. Registers include memory and other data storage elements as well as processing elements that operate in a binary or non-binary fashion. As used herein, a weighting device is an element that resistively modifies the transmission of a signal. In a typical embodiment, a weighting device links two or more devices in a network of devices and regulates the intensity or magnitude of the signal transmitted between or among devices. In many computing applications, it is desirable to preserve the secrecy of information that is stored in or processed by one or a group of registers or weighting devices, and various encryption and protection schemes have been devised in the prior art for the silicon-based or non-silicon-based memory and processing devices that dominate today's marketplace. The focus in this invention is the protection of information in non-silicon based registers or weighting devices. More specifically, the instant invention is concerned with preventing unwanted access to conventional registers or weighting devices or to those that utilize a phase-change material as the working medium.

The registers included in an embodiment of the instant secured devices have been previously described in the '710, '954, and '953 patents and include two-terminal phase-change devices. The weighting devices have been previously described in the '953 patent and include two-terminal phase-change devices. The registers store and/or process information through manipulations of the structural state of a phase-change material according to one mechanism. The weighting devices resistively modify the transmission of electrical signals passing through themselves by manipulations of the structural state of a phase-change material according to a second mechanism. The mechanisms of structural variations are described in more detail hereinbelow.

Figure 1:
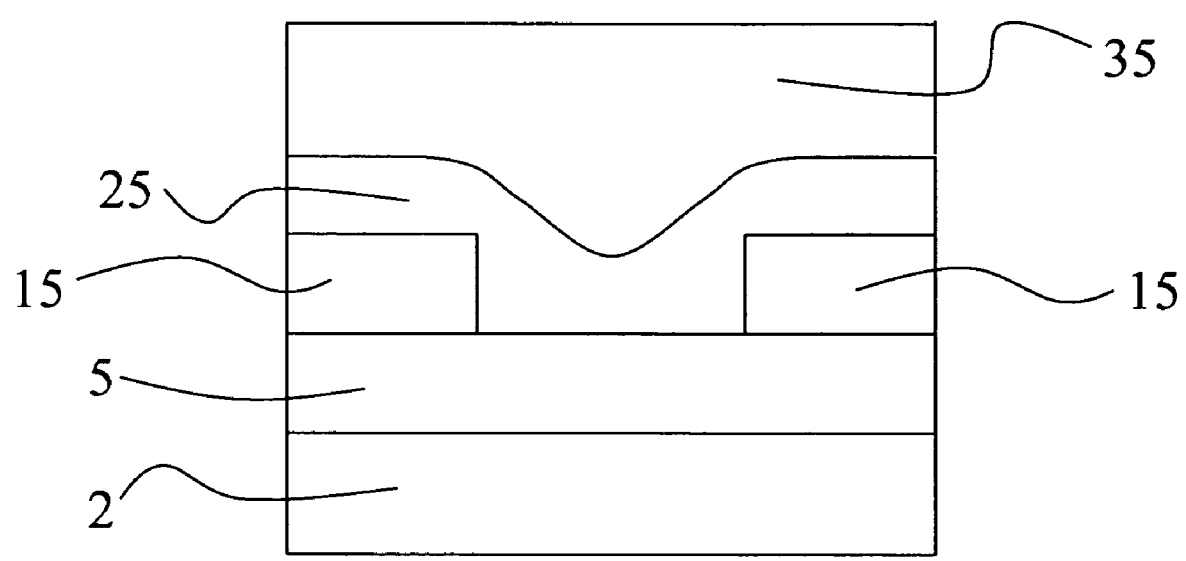
FIG. 1. Schematic depiction of a representative two-terminal phase-change device.

As described hereinabove, the registers and weighting devices that may be used as phase-change elements in the instant secured devices include two-terminal phase-change devices such as those described or incorporated by reference in the '710, '954, and '953 patents. Among those devices are the two-terminal devices discussed in U.S. Pat. Nos. 5,714,768, 5,912,839 and 6,141,241, the disclosures of which are hereby incorporated by reference. These patents include a description of device structures, materials, growth methods, layer thicknesses etc. A representative two-terminal device that may be used as a register or weighting device is shown in FIG. 1. The device includes a substrate 2 (e.g. Si), lower electrical contact 5 (e.g. carbon, a metal or metal alloy, typical thickness of a few to several hundred angstroms (e.g. 600 Å)), insulating layer 15 (e.g. $SiN_x$, $SiO_2$, typical thickness of a few to several hundred angstroms (e.g. 800 Å)), phase-change material 25 (having typical layer thickness outside of central pore of a few to several hundred angstroms (e.g. 600 Å)), and upper electrical contact 35 (e.g. carbon, a metal or metal alloy, typical thickness of several hundred to a few thousand angstroms (e.g. 2000 Å)). Further details concerning materials and dimensions for electrical terminals or contacts, insulating materials, and other layers are similar to those previously described in the '344, and '867 patents and in the '285 and '022 applications.

Phase-change materials suitable for use in the instant invention are materials capable of transforming between or among two or more detectably-distinct structural states. The distinct structural states may be distinguished on the basis of, for example, crystal structure, atomic arrangement, order or disorder, fractional crystallinity, relative proportions of two or more different structural states (e.g. proportions of crystalline and amorphous phases), a physical (e.g. electrical, optical, magnetic, mechanical) or chemical property etc. In a preferred embodiment, the transformations between or among structural states are reversible so that the original state of a transformed material can be restored subsequent to a structural transformation.

In a preferred embodiment, chalcogenide materials are used as the phase-change material in the registers and weighting devices of the instant secured devices. Chalcogenide materials have been previously utilized in optical and electrical memory, and switching applications and some representative compositions and properties have been discussed in U.S. Pat. Nos. 5,543,737; 5,694,146; 5,757,446; 5,166,758; 5,296,716; 5,534,711; 5,536,947; 5,596,522; and 6,087,674; the disclosures of which are hereby incorporated by reference herein, as well as in several journal articles including "Reversible Electrical Switching Phenomena in Disordered Structures", Physical Review Letters, vol. 21, p. 1450–1453 (1969) by S. R. Ovshinsky; "Amorphous Semiconductors for Switching, Memory, and Imaging Applications", IEEE Transactions on Electron Devices, vol. ED-20, p. 91–105 (1973) by S. R. Ovshinsky and H. Fritzsche; the disclosures of which are hereby incorporated by reference herein. General characteristics and comments about the properties of phase-change chalcogenide materials that are helpful in the understanding of the instant invention are provided in the following discussion.

Representative chalcogenide materials suitable for use in the registers of the instant invention are those that include one or more elements from column VI of the periodic table (the chalcogen elements) and optionally one or more chemical modifiers from columns III, IV or V. One or more of S, Se, and Te are the most common chalcogen elements included in the chalcogenide data storage material of the instant memory devices. Suitable modifiers include one or more of trivalent and tetravalent modifying elements such as As, Ge, Ga, Si, Sn, Pb, Al, Sb, In, and Bi. Transition metals such as Cu, Ni, Zn, Ag, and Cd may also be used as modifiers. A preferred chalcogenide composition includes one or more chalcogenide elements along with one or more trivalent or tetravalent modifiers and/or one or more transition metal modifiers. Materials that include Ge, Sb, and/or Te, such as $Ge_2Sb_2Te_5$, are examples of chalcogenide materials in accordance with the instant invention.

The chalcogen elements are characterized by divalent bonding and the presence of lone pair electrons. The divalent bonding leads to the formation of chain and ring structures upon combining chalcogen elements to form chalcogenide materials, and the lone-pair electrons provide a source of electrons for forming a conducting filament in switching applications. The conducting filament may also contribute to or aid in driving phase changes that occur between different structural states. Trivalent, tetravalent and transition metal modifiers may enter the chain and ring structures of chalcogen elements and provide points for branching and crosslinking. The structural rigidity of chalcogenide materials depends on the extent of crosslinking and influences their ability to undergo crystallization or other structural transformations or rearrangements.

An important feature of the chalcogenide materials in the operation of the registers and weighting devices of the instant secured devices is their ability to undergo a phase transformation between or among two or more structural states. The chalcogenide materials have structural states that include a crystalline state, one or more partially-crystalline states and an amorphous state. The crystalline state may be a single crystalline state or a polycrystalline state. As used herein, a partially-crystalline state refers to a structural state of a volume of chalcogenide material that includes an amorphous portion and a crystalline portion. Preferably, a plurality of partially-crystalline states exists for the phase-change material that may be distinguished on the basis of the relative proportion of the amorphous and crystalline portions. Fractional crystallinity is one way to characterize the structural states of a chalcogenide phase-change material. The fractional crystallinity of the crystalline state is 100%, the fractional crystallinity of the amorphous state is 0%, and the partially-crystalline states have fractional crystallinities that vary continuously between 0% (the amorphous limit) and 100% (the crystalline limit). Phase-change chalcogenide materials are thus able to transform among a plurality of structural states that vary inclusively between fractional crystallinities of 0% and 100%.

The ability and facility of a chalcogenide material to undergo structural transformations among structural states having various fractional crystallinities depends on the composition and structural characteristics of the chalcogenide material. More highly crosslinked chalcogenide materials are more structurally rigid and generally include a higher concentration of modifiers. The more highly crosslinked chalcogenide materials are more difficult to crystallize because the atomic rearrangements required to nucleate and grow a crystalline phase are inhibited due to the rigidity of the structure. More lightly crosslinked chalcogenide materials more readily undergo full or partial crystallization.

Transformations among the structural states of a chalcogenide material are induced by providing energy to the chalcogenide material. Energy in various forms can influence the fractional crystallinity of a chalcogenide material and hence induce structural transformations. Suitable forms of energy include electrical energy, thermal energy, optical energy or other forms of energy (e.g. particle-beam energy) that induce electrical, thermal or optical effects in a chalcogenide material or combinations of the foregoing forms of energy. Continuous and reversible variability of the fractional crystallinity is achievable by controlling the energy environment of a chalcogenide material. A crystalline state can be transformed to a partially-crystalline or an amorphous state, a partially-crystalline state can be transformed to a crystalline or amorphous state, and an amorphous state can be transformed to a partially-crystalline or crystalline state through proper control of the energy environment of a chalcogenide material. Some considerations associated with the use of thermal, electrical and optical energy to induce structural transformations are presented in the following discussion.

The use of thermal energy to induce structural transformations exploits the thermodynamics and kinetics associated with the crystalline to amorphous or amorphous to crystalline phase transitions. An amorphous phase may be formed, for example, from a partially-crystalline or crystalline state by heating a chalcogenide material above its melting temperature and cooling at a rate sufficient to inhibit the formation of crystalline phases. A crystalline phase may be formed from an amorphous or partially-crystalline state, for example, by heating a chalcogenide material above the crystallization temperature for a sufficient period of time to effect nucleation and/or growth of crystalline domains. The crystallization temperature is below the melting temperature and corresponds to the minimum temperature at which crystallization may occur. The driving force for crystallization is typically thermodynamic in that the free energy of a crystalline or partially-crystalline state is lower than the free energy of an amorphous state so that the overall energy of a chalcogenide material decreases as the fractional crystallinity increases. Formation (nucleation and growth) of a crystalline state or crystalline domains within a partially-crystalline state is kinetically inhibited, however, so that heating below the melting point promotes crystallization by providing energy that facilitates the rearrangements of atoms needed to form a crystalline phase or domain. The fractional crystallinity of a partially-crystalline state can be controlled by controlling the temperature or time of heating of the partially-crystalline state or by controlling the temperature or rate of cooling of an amorphous or partially-crystalline state.

Figure 2:
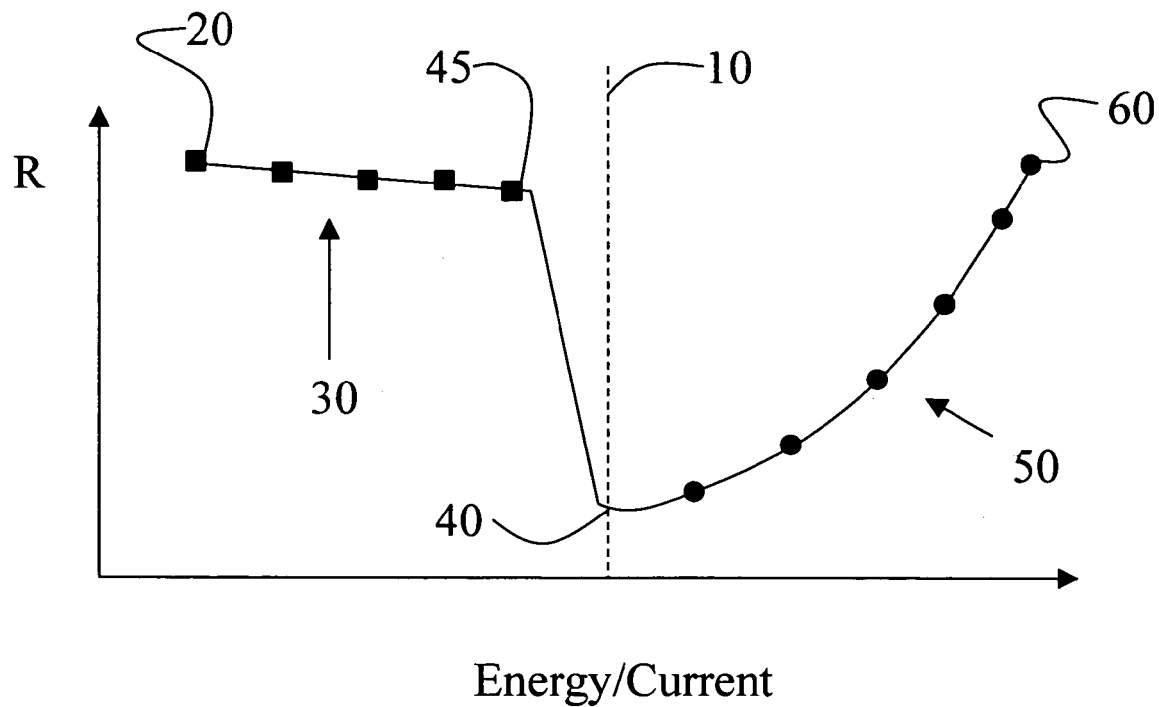
FIG. 2. Representative dependence of the electrical resistance of a two-terminal phase-change device as a function of energy or current.

The use of electrical energy to induce structural transformations relies on the application of electrical (current or voltage) pulses to a chalcogenide material. The mechanism of electrically induced structural transformations may be electronic in nature, possibly with an accompanying or consequent thermal contribution. By controlling the magnitude and/or duration of electrical pulses applied to a chalcogenide material, it is possible to vary continuously the fractional crystallinity. The influence of electrical energy on the structure of a chalcogenide material is frequently depicted in terms of the variation of the electrical resistance of a chalcogenide material with the amount of electrical energy provided or the magnitude of the current or voltage pulse applied to a chalcogenide material. A representative depiction of the electrical resistance (R) of a chalcogenide material as a function of electrical energy or current pulse magnitude (Energy/Current) is presented in FIG. 2 herein. FIG. 2 shows the variation of the electrical resistance of a chalcogenide material with electrical energy or current pulse magnitude and may generally be referred to as a resistance plot.

The resistance plot includes two characteristic response regimes of a chalcogenide material to electrical energy. The regimes are approximately demarcated with the vertical dashed line 10 shown in FIG. 2. The regime to the left of the line 10 may be referred to as the accumulating regime of the chalcogenide material. The accumulation regime is distinguished by a nearly constant or gradually varying electrical resistance with increasing electrical energy that culminates in an abrupt decrease in resistance at and beyond a threshold energy. The accumulation regime thus extends, in the direction of increasing energy, from the leftmost point 20 of the resistance plot, through a plateau region (generally depicted by 30) corresponding to the range of points over which the resistance variation is small or gradual to the set point or state 40 that follows an abrupt decrease in electrical resistance. The plateau 30 may be horizontal or sloping. The left side of the resistance plot is referred to as the accumulating regime because the structural state of the chalcogenide material continuously evolves as energy is applied, with the fractional crystallinity of the structural state correlating with the total accumulation of applied energy. The leftmost point 20 corresponds to the structural state in the accumulating regime having the lowest fractional crystallinity and may be referred to as the reset state. This state may be fully amorphous or may contain some residual crystalline content. As energy is added, the fractional crystallinity increases, and the chalcogenide material transforms in the direction of increasing applied energy among a plurality of partially-crystalline states along the plateau 30. Selected accumulation states (structural states in the accumulation region) are marked with squares in FIG. 2. Upon accumulation of a threshold amount of applied energy, the fractional crystallinity of the chalcogenide material increases sufficiently to effect a setting transformation characterized by a dramatic decrease in electrical resistance and stabilization of the set state 40. The structural states in the accumulation regime may be referred to as accumulation states of the chalcogenide material. Structural transformations in the accumulating regime are unidirectional in the sense that they progress in the direction of increasing applied energy within the plateau region 30 and are reversible only by first driving the chalcogenide material through the set point 40 and resetting as described in, for example, the '954 and '953 patents.

While not wishing to be bound by theory, the instant inventors believe that the addition of energy to a chalcogenide material in the accumulating regime leads to an increase in fractional crystallinity through the nucleation of new crystalline domains, growth of existing crystalline domains or a combination thereof. It is believed that the electrical resistance varies only gradually along the plateau 30 despite the increase in fractional crystallinity because the crystalline domains form or grow in relative isolation of each other so as to prevent the formation of a contiguous crystalline network that spans the chalcogenide material. This type of crystallization may be referred to as sub-percolation crystallization. The setting transformation coincides with a percolation threshold in which a contiguous, interconnected crystalline network forms within the chalcogenide material. Such a network may form, for example, when crystalline domains increase sufficiently in size to impinge upon neighboring domains. Since the crystalline phase of chalcogenide materials is more conductive and less resistive than the amorphous phase, the percolation threshold corresponds to the formation of a contiguous low resistance conductive pathway through the chalcogenide material. As a result, the percolation threshold is marked by a dramatic decrease in the resistance of the chalcogenide material. The leftmost point of the accumulation regime may be an amorphous state or a partially-crystalline state lacking a contiguous crystalline network. Sub-percolation crystallization commences with an initial amorphous or partially-crystalline state and progresses through a plurality of partially-crystalline states having increasingly higher fractional crystallinities until the percolation threshold is reached and the setting transformation occurs. Further discussion of the behavior of chalcogenide materials in the accumulation regime is provided in the '867, '954, and '953 patents and in U.S. Pat. Nos. 5,912,839 and 6,141,241; the disclosures of which are hereby incorporated by reference herein.

The regime to the right of the line 10 of FIG. 2 may be referred to as the grayscale regime or grayscale region. The grayscale regime extends from the set state 40 through a plurality of intermediate states (generally depicted by 50) to a reset point or state 60. The various points in the grayscale regime may be referred to as grayscale states of the chalcogenide material. Selected grayscale states are marked with circles in FIG. 2. Structural transformations in the grayscale regime may be induced by applying an electric current or voltage pulse to a chalcogenide material. In FIG. 2, an electric current pulse is indicated. In the grayscale regime, the resistance of the chalcogenide material varies with the magnitude of the applied electric pulse. The resistance of a particular state in the grayscale regime is characteristic of the structural state of the chalcogenide material, and the structural state of a chalcogenide material is dictated by the magnitude of the current pulse applied in the grayscale region. The fractional crystallinity of the chalcogenide material decreases as the magnitude of the current pulse increases. The fractional crystallinity is highest for grayscale states at or near the set point 40 and progressively decreases as the reset state 60 is approached. The chalcogenide material transforms from a structural state possessing a contiguous crystalline network at the set state 40 to a structural state that is amorphous or substantially amorphous or partially-crystalline without a contiguous crystalline network at the reset state 60. The application of current pulses having increasing magnitude has the effect of converting portions of the crystalline network into an amorphous phase and ultimately leads to a disruption or interruption of contiguous high-conductivity crystalline pathways in the chalcogenide material. As a result, the resistance of the chalcogenide material increases as the magnitude of an applied current pulse increases in the grayscale region.

In contrast to the accumulating region, structural transformations that occur in the grayscale region are reversible, bi-directional, and this region may thus also be referred to as the direct overwrite region of the resistance plot. The response of a chalcogenide material to a current pulse is determined by the magnitude of the current pulse relative to the magnitude of the current pulse associated with the initial state of the chalcogenide material at the time the current pulse is applied. As indicated hereinabove, each state in the grayscale region may be identified by its resistance and a current pulse magnitude, where application of that current pulse magnitude induces changes in fractional crystallinity that produce the particular resistance value of the state. Application of a subsequent current pulse may increase or decrease the fractional crystallinity relative to the fractional crystallinity of the initial state of the chalcogenide material. If the subsequent current pulse has a higher magnitude than the pulse used to establish the initial state, the fractional crystallinity of the chalcogenide material decreases and the structural state is transformed from the initial state in the direction of the reset state along the greyscale resistance curve. Similarly, if the subsequent current pulse has a lower magnitude than the pulse used to establish the initial state, the fractional crystallinity of the chalcogenide material increases and the structural state is transformed from the initial state in the direction of the set state along the grayscale resistance curve. Further discussion of the properties of chalcogenide materials in the grayscale region may be found, for example, in U.S. Pat. Nos. 5,296,716 and 5,414,271; the disclosures of which are hereby incorporated by reference herein.

Chalcogenide phase-change devices in accordance with the instant secured devices include those that operate in either or both of the accumulation or greyscale regimes of the resistance plot. The '710, '954, and '953 patents describe cognitive registers that operate in the accumulation regime between the reset state 20 and set state 40, inclusive. These cognitive registers may be used to store or process data or information in a binary or non-binary fashion or to encrypt data or information. Cognitive registers may thus be used as encryption devices as described in the '710 patent. The '953 patent describes weighting devices that operate in the grayscale region between the set state 40 and reset state 60, inclusive. The weighting devices resistively modify signals transmitted between circuit elements connected thereto so that the level or magnitude of the signal transmitted from one circuit element to another may be modulated or otherwise varied by controlling the resistive state of the weighting device. The current passing through a weighting device is modified via the resistance or resistive state of the weighting device. In a preferred embodiment, a weighting device has two or more resistance states, each of which is distinguished by a different resistance value. The weighting devices may be used, for example, as interconnection devices in circuits or to weight input signals provided to a circuit element, including nodes of neural networks or the cognitive registers described hereinabove. The resistance of a weighting device may possess interpretative significance (e.g. in neural network applications the resistance corresponds to a weighting factor which may be viewed as a form of memory with respect to neural processing; information may also be encoded through the resistance of a weighting device), and it may thus be desirable to protect it via the secured device of the instant invention.

As described hereinabove, the resistance of a phase-change material depends on the structural state of the phase-change material. The resistance also depends on the thickness of the phase-change material, the diameter of the central pore it occupies in the device structure, and its composition. For a layer of phase-change material having the composition $Ge_{22}Sb_{22}Te_{56}$, a thickness of ~600 Å, and pore diameter of ~0.1 µm, for example, the resistance of the reset state is ~1000 kΩ and the resistance of the set state is ~1 kΩ. Phase-change materials in general show resistances in the range of ~100 kΩ to ~1000 kΩ in the reset state and resistance of ~0.1 kΩ to ~10 kΩ in the set state. In the preferred phase-change materials, the resistance of the reset state is at least a factor of two, and more typically an order of magnitude or more, greater than the resistance of the set state. The resistances of the reset and set states generally correspond to the range of resistances possible for a phase-change material in both the accumulation regime and the grayscale regime.

The instant secured devices combine a security element with a phase-change device such as a register or weighting device. The security element is a three-terminal device that is combined in parallel with a register or weighting device to provide a secured device according to the instant invention. The security element may be a conventional silicon based transistor or a three-terminal phase-change device such as those described in the '344 and '867 patents. A schematic depiction of a secured device according to the instant invention is provided in FIG. 3. The device includes a parallel combination 105 having a security element 110 and a phase-change element 120. Control systems 130 and 140 for the security element 110 and phase-change element 120, respectively, are also included. The phase-change element 120 may be a register or weighting device and includes a phase-change material as the working substance. In a preferred embodiment, the phase-change material is a chalcogenide such as those described hereinabove. The phase-change element may utilize accumulation states, grayscale states or a combination thereof in its operation as a processing or storage element.

Figure 3:
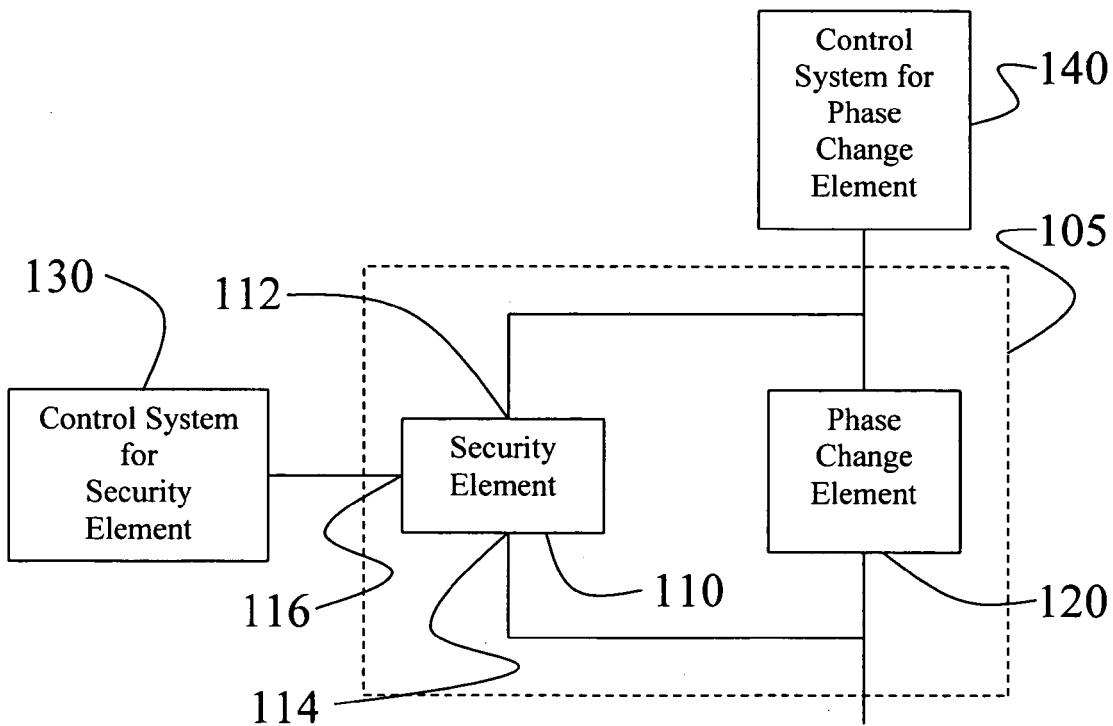
FIG. 3. Schematic depiction of a secured device according to the instant invention.

The security element 110 includes three terminals, 112, 114 and 116. Terminals 112 and 114 are used to establish parallel connectivity of the security element 110 with the phase-change device 120 as shown in FIG. 3. Terminal 116 is connected to controlling electronics 130 that are used to control the state of the security element 110. More specifically, a control signal provided from control system 130 may be used to regulate the current flow or resistance between terminals 112 and 114 of the security element. In an embodiment in which the security element 110 is a transistor, for example, terminal 116 may be a gate terminal that regulates the current flow between terminals 112 and 114 that function respectively as base and emitter terminals (or vice versa). In an embodiment in which the security element 110 is a three-terminal chalcogenide device, terminal 116 may be a control terminal that modulates the current flow or resistance between terminals 112 and 114. As described in the '344 and '867 patents, the control terminal of a multi-terminal chalcogenide device may influence current flow, filament formation or resistance through, for example, the direct injection of carriers or via a field effect.

The control system 140 includes the electronics necessary to provide the current or voltage pulses needed to influence the structural state, fractional crystallinity etc. of the phase-change material as described hereinabove. The control system 140 generally provides for current or voltage pulses having amplitudes and durations over a wide range of conditions and having a wide range of possible pulse profiles. Representative pulses have durations on the order of nanoseconds to microseconds with current amplitudes in the milliamp range. The control system 140 is capable of providing set pulses, reset pulses, and incrementing pulses as well as the pulses needed to vary the resistance in the grayscale regime. The control system 140 may also include instrumentation needed to read the resistance of the phase-change material. The control system may be used for phase-change materials that operate in either or both of the accumulation and grayscale regimes described hereinabove.

The control system 130 may be used to reversibly switch the security element 110 between an ON state and an OFF state. In the ON state, the security element is active and protects the phase-change element from electrical interrogation by drawing current provided to the parallel combination 105, thereby diverting at least a portion of the current applied to the parallel combination 105 away from the phase-change device 120. Diversion of current away from the phase-change device prevents, inhibits or confuses a reading of the resistance of the phase-change device, thus affording a degree of protection of the resistance of the phase-change device. Diversion of current away from the phase-change element may occur, for example, when the resistance of the security element 110 in its ON state is less than the resistance of the phase-change element. The diversion of current may be partial or complete. Since knowledge of the resistance of the phase-change device is generally needed to acquire information from the phase-change device, the phase-change device is protected when the security element is in its ON state. When the security element is in the ON state, the secured device may be said to be in PROTECT mode.

In the OFF state, the security element is inactive and permits the electrical interrogation of the phase-change device so that its resistance or electrical state may be probed and unambiguously determined. While inactive, the security element permits current applied to the parallel combination 105 to directly interact with the phase-change device 120 without materially diverting current therefrom and without materially impacting its resistance. When the OFF state of the security element, for example, has a higher resistance than the phase-change element, current preferentially passes through the phase-change element. As the OFF-state resistance increases relative to the resistance of the phase-change element, the resistance of the parallel combination more closely approaches that of the phase-change element. Further discussion of the influence of the relative resistances of the security and phase-change elements is provided hereinbelow. When the security element is in the OFF state, the secured device may be said to be in READ mode.

The underlying principle of operation of the instant secured device may be understood through an analysis of the resistance of the parallel combination 105. As is known in the art of parallel circuits, the resistance of a parallel combination of two circuit elements is given by $$\frac{1}{R_{Combination}} = \frac{1}{R_1} + \frac{1}{R_2},$$

where $R_1$ and $R_2$ are the individual resistances of the two elements connected in parallel. From this relation, it is evident that the resistance of the parallel combination is determined primarily by the element of the combination having the lower resistance. This follows from the fact that current flows preferentially through low-resistance pathways. As the disparity in the individual resistances increases, a greater fraction of the current applied to the combination passes through the element having the lower resistance.

In the parallel combination of the instant invention, a security element and a phase-change element or device are connected in parallel. If we let S be the resistance of the security element and $R_{PC}$ be the resistance of the phase-change element or device, we can express the resistance of the combination as $$\frac{1}{R_{Combination}} = \frac{1}{S} + \frac{1}{R_{PC}}.$$

The resistance of the parallel combination depends on both the state of the security element and structural state of the phase-change material. The resistance of the security element differs for the ON and OFF states as described hereinabove, with the OFF state having a lower resistance than the ON state. In this discussion, we let $S_1$ and $S_2$ be the resistances of the OFF and ON states of the security element, respectively. The resistance of the phase-change device is essentially that of the active phase-change material of the device. As described hereinabove, the resistance of the phase-change material is essentially maximized in the reset state and is essentially minimized in the set state. In this discussion, we let $R_{Reset}$ and $R_{Set}$ correspond to the resistances of the reset and set states, respectively.

In READ mode, the security element is in its OFF state, and the resistance of the parallel combination is given by $$\frac{1}{R_{Combination}} = \frac{1}{S_1} + \frac{1}{R_{PC}}.$$

In order to operate optimally in READ mode, it is preferable for the resistance of the combination to approximate closely the resistance of the phase-change device. In this way, the resistance measured for the combination accurately reflects the structural state of the phase-change material, and information may be reliably acquired from the phase-change device. This preferred condition requires that the OFF-state resistance of the security element be greater than the resistance of the phase-change material so that the resistance of the parallel combination approaches that of phase-change device. Mathematically, the condition can be stated $S_1 > R_{PC}$. The resistance of the combination in the READ mode can thus be more properly expressed in the manner now shown. We begin with $$\frac{1}{R_{Combination}} = \frac{1}{S_1} + \frac{1}{R_{PC}} = \frac{R_{PC} + S_1}{R_{PC}S_1}$$

and rearrange to obtain $$R_{Combination} = \frac{R_{PC}S_1}{R_{PC}+S_1} = R_{PC}\left[\frac{S_1}{R_{PC}+S_1}\right] = R_{PC}\left[\frac{1}{1+\frac{R_{PC}}{S_1}}\right].$$

Since $R_{PC}/S_1 < 1$, we can approximate the expression in brackets through use of a Taylor expansion to obtain $$R_{Combination} \cong R_{PC}\left[1 - \frac{R_{PC}}{S_1}\right].$$

In a preferred embodiment $R_{PC} \ll S_1$, and the approximation becomes $$R_{Combination} \cong R_{PC},$$

so that the presence of the security element has essentially no effect on the resistance of the parallel combination.

As discussed hereinabove, the resistance of the phase-change element is determined primarily by the resistance of the phase-change material, and the resistance of the phase-change material varies between the resistance of the set state $R_{Set}$ and the resistance of the reset state $R_{Reset}$. In order to read effectively over all states in the accumulation and/or grayscale regimes, it is most preferred that $S_1 \gg R_{Reset}$.

Preferred conditions for the ON-state resistance of the security element in PROTECT mode may be similarly derived. In PROTECT mode, the role of the security element in the parallel combination is to interfere with a determination of the resistance of the phase-change device. The resistance of the ON state of the security element is accordingly required to be lower than the resistance of the OFF state. The resistance of the instant parallel combination when the security element is in the ON state is given by $$\frac{1}{R_{Combination}} = \frac{1}{S_2} + \frac{1}{R_{PC}}.$$

Interference of the security element with the phase-change element or device occurs when the measured resistance of the parallel combination is not primarily determined by the resistance of the phase-change device. In one embodiment, the ON-state resistance $S_2$ is comparable to the phase-change resistance $R_{PC}$ so that both resistances contribute meaningfully to the resistance of the parallel combination. Under this condition, $S_2 \approx R_{PC}$ and the separate resistances $S_2$ and $R_{PC}$ are strongly intermingled in the parallel resistance, thereby confusing the unambiguous determination of $R_{PC}$ and providing a measure of security over the state or information content of the phase-change element or device. This condition constitutes an embodiment of the instant invention.

With respect to states in the accumulation regime, it is adequate that the ON-state resistance be comparable to the resistance along the high resistance plateau 30 shown in FIG. 2. The reset state is generally the highest resistance state in the accumulation regime. Since the high resistance plateau 30 may be sloping as described hereinabove, the resistance may decrease in the direction of the set state 40 with a minimum resistance occurring for the accumulation state 45 that immediately precedes the set state. The resistance of the accumulation state that immediately precedes the set state is herein designated $R_L$. In one embodiment of the instant invention, $S_2 \approx R_{Reset}$ and in another embodiment, $S_2 \approx R_L$. Since the resistance $R_L$ is greater than the resistance of the set state $R_{Set}$, the condition $S_2 \approx R_L$ may not adequately protect the set state of the phase-change device. Consequently, in a further embodiment of the instant invention the ON-state resistance conforms to $S_2 \approx R_{Set}$. Since the resistance values in the grayscale regime also generally range between $R_{Reset}$ and $R_{Set}$, similar considerations as to the ON-state resistance apply to use of the instant device to secure states in the grayscale regime.

As the ON-state resistance $S_2$ becomes increasingly smaller than the phase-change resistance $R_{PC}$, the security element increasingly dominates the performance of the parallel combination as the current applied to the combination increasingly flows through it. The resistance of the parallel combination increasingly approaches that of the security element. This can be seen mathematically by rewriting the preceding formula and simplifying as follows:

$$R_{Combination} = \frac{R_{PC}S_2}{R_{PC}+S_2} = S_2\left[\frac{1}{1+\frac{S_2}{R_{PC}}}\right] \cong S_2\left[1 - \frac{S_2}{R_{PC}}\right],$$

where the final approximation is an embodiment that recognizes $S_2 < R_{PC}$ and is based on a Taylor expansion. With respect to states of the phase-change material in the accumulation regime, it is sufficient that $S_2 < R_L$, where $R_L$ is the resistance of the accumulation state that immediately precedes the set state. In another embodiment, $S_2 < R_{Set}$.

As a further embodiment, the ON-state resistance may satisfy the condition $S_2 \ll R_{PC}$, in which case the parallel resistance becomes:

$$R_{Combination} \cong S_2.$$

The foregoing embodiments may also be used to secure grayscale states.

The foregoing resistance analysis indicates that the relative resistances of the security and phase-change elements of the parallel combination of the instant secured devices are important in establishing the mode of operation and functionality of the instant invention. The security elements of the instant invention thus include at least an ON state and an OFF state, where the ON-state resistance is lower than the OFF-state resistance. Security elements of the instant invention include conventional transistors and three-terminal phase-change devices and can be configured or controlled to provide resistances relative to the resistance of the phase-change element to provide the functionality described in the foregoing resistance analysis.

In an embodiment in which the security element is a transistor, for example, the source and drain terminals are preferably used to form the parallel connection to the phase-change element and the gate terminal is used to regulate the resistance between the source and drain terminals. As is well known in the art, the presence, absence, polarity, or magnitude of signal applied to a gate terminal influences the ability of current to flow between source and drain terminals. Transistors suitable for use in the instant invention include bipolar, FET, JFET, MOSFET, etc.

In the ON state, a gate signal is applied so that the transistor readily permits the flow of current between source and drain. Alternatively, a gate signal may be viewed in terms of its ability to modify the resistance between source and drain terminals. A gate signal that permits the flow of current between source and drain does so by reducing the resistance of the semiconductor material (e.g. doped silicon) between the source and drain terminals. In the ON state, the resistance between the source and drain terminals is low and in a typical transistor is much lower than the resistance of a phase-change material.

In the OFF state, a gate signal is applied so that the transistor inhibits the flow of current between source and drain by increasing the resistance of the semiconductor material present between the source and drain terminals. In a typical transistor, the gate signal modulates the width of the depletion region in the vicinity of one or more p-n junctions present in the active region of the transistor. The depletion region is a region of high resistance due to a low concentration of charge carriers. By varying the gate signal, the width of the depletion region, and thus the resistance between source and drain terminals, can be modulated or continuously varied from low resistance to high resistance. In the ON state, the depletion region is narrow and current readily flows through portions of the active semiconductor material of the transistor adjacent to the depletion region. In the OFF state, the depletion region is wide and effectively occupies the entirety of the semiconductor material present between source and drain terminals, thereby leading to a high resistance state. A gate signal of appropriate magnitude can partially or completely pinch off the flow of current between the source and drain terminals and thus induce current applied to the parallel combination of the instant invention to flow partially or completely through the phase-change element, a condition desired for READ mode of the instant device.

Similar considerations pertain to the use of a three-terminal phase-change device as a security element of the instant invention. As described in the '344 and '867 patents, three-terminal phase-change devices utilize a control terminal to regulate the current flowing between two other (non-control) terminals of the device. The non-control terminals are used to establish parallel connectivity with the phase-change element of the instant invention. A signal applied to a control terminal may increase or decrease the current flowing between the non-control terminals and may do so through a current-injection mechanism or a field-effect mechanism. An increase in current flow corresponds to a decrease in the resistance of the phase-change material between the terminals through which the current flows and vice versa. In the context of the instant invention, the ON state of a three-terminal phase-change device is a state in which the control signal facilitates current flow through current injection of a field effect mechanism that lowers the resistance to current flow between a pair of terminals. Similarly, the OFF state of a three-terminal phase-change device is a state in which the control signal inhibits or prevents current flow between a pair of terminals. Since the range of control signals is continuously variable, a continuous range of resistances between two non-control terminals is available and may be used in the context of the instant invention. Resistances that are larger than, comparable to or smaller than the resistance of the phase-change element of the instant invention are available.

The resistance between the non-control terminals of a multi-terminal phase-change device may also be controlled through design of the device to achieve resistances in the ON and OFF states that conform to the various relative resistances described in the resistance analysis hereinabove. The composition of the phase-change material in a multi-terminal phase-change device may differ, for example, from that used in the phase-change element. The resistances of different phase-change material compositions are known to vary by an order or magnitude or more in either or both of the amorphous or crystalline phases. The fractional crystallinity of the phase-change material in a multi-terminal phase-change device may differ from that of the phase-change material in a phase-change element to provide another mechanism for differentiating resistance. The device geometry provides further flexibility in controlling the resistance of a phase-change security element relative to a phase-change register or weighting device. Resistance varies with the thickness and cross-sectional area of the phase-change material as well as with contact area and separation between contacts. A thicker layer of phase-change material (or greater separation between the terminals through which current passes) leads to a higher resistance. Thus, where it is desired for the resistance of the OFF state of a three-terminal phase-change security element to be higher than the resistance of a phase-change element, one may, for the three-terminal security element, do one or a combination of the following: choose a phase-change material composition having a higher resistance, construct a device having a thicker layer of phase-change material, construct a device having a separation between non-control terminals that is larger than the separation between terminals of the phase-change element, choose an OFF state having a lower fractional crystallinity than the lowest fractional crystallinity state of the phase-change element etc. and vice versa where a lower resistance is desired. The ON state of a three-terminal phase-change device involves formation of a conductive filament corresponding to a low-resistance current pathway that is intrinsically more conductive than even the crystalline state of the phase-change material in a phase-change element.

The instant invention further includes methods of protecting information or data. The method includes providing the instant secured device, storing data or information in the phase-change element of the device, and transforming the security element to its ON state.

The disclosure and discussion set forth herein is illustrative and not intended to limit the practice of the instant invention. While there have been described what are believed to be the preferred embodiments of the instant invention, those skilled in the art will recognize that other and further changes and modifications may be made thereto without departing from the spirit of the invention, and it is intended to claim all such changes and modifications that fall within the full scope of the invention. It is the following claims, including all equivalents, in combination with the foregoing disclosure and knowledge commonly available to persons of skill in the art, which define the scope of the instant invention.

We claim:

1. A secured device comprising:
   a security element, said security element having an ON state and an OFF state, the resistance of said ON state being lower than the resistance of said OFF state; and
   a phase-change element, said phase-change element comprising a phase-change material, said phase-change material being reversibly transformable between two or more structural states;
   wherein said security element and said phase-change device are connected in parallel.

2. The device of claim 1, wherein said security element is a transistor.

3. The device of claim 1, wherein said security element is a multi-terminal phase-change device, said multi-terminal phase-change device including a first terminal, a second terminal and a third terminal, said second and third terminals forming said parallel connection with said phase-change element, said multi-terminal phase-change device comprising a phase-change material, said phase-change material being reversibly transformable between two or more structural states.

4. The device of claim 3, wherein said first terminal modulates the current passing between said second terminal and said third terminal.

5. The device of claim 4, wherein said first terminal modulates said current through injection of charge carriers.

6. The device of claim 4, wherein said first terminal modulates said current through a field effect.

7. The device of claim 1, wherein said phase-change element is a register.

8. The device of claim 7, wherein said register processes or stores data or information in a non-binary fashion.

9. The device of claim 7, wherein said register encrypts data or information.

10. The device of claim 1, wherein said phase-change element is a weighting device, said weighting device having two or more resistance states, said weighting device resistively modifying transmission of an electrical signal passing therethrough.

11. The device of claim 1, wherein said phase-change material comprises S, Se, or Te.

12. The device of claim 11, wherein said phase-change material further comprises Ge or Sb.

13. The device of claim 11, wherein said phase-change material further comprises As or Si.

14. The device of claim 11, wherein said phase-change material further comprises an element selected from the group consisting of Al, In, Bi, Pb, Sn, P, and O.

15. The device of claim 1, wherein said structural states include amorphous, crystalline or partially-crystalline states.

16. The device of claim 1, wherein said structural states differ in fractional crystallinity.

17. The device of claim 1, wherein said structural states of said phase-change material include one or more accumulation states.

18. The device of claim 1, wherein said structural states of said phase-change material include two or more accumulation states.

19. The device of claim 1, wherein said structural states of said phase-change material include three or more accumulation states.

20. The device of claim 1, wherein said structural states of said phase-change material include a grayscale state.

21. The device of claim 1, wherein the resistance of said device is approximately equal to the resistance of said phase-change element.

22. The device of claim 1, wherein the resistance of said device is approximately equal to the resistance of said security element.

23. The device of claim 1, wherein said structural states include a reset state and a set state.

24. The device of claim 23, wherein the resistance of said OFF state is greater than the resistance of said reset state.

25. The device of claim 23, wherein the resistance of said OFF state is greater than the resistance of said set state.

26. The device of claim 23, wherein the resistance of said ON state is less than the resistance of said reset state.

27. The device of claim 26, wherein the resistance of said ON state is greater than the resistance of said set state.

28. The device of claim 23, wherein the resistance of said ON state is less than the resistance of said set state.

29. A method of protecting information or data comprising the steps of
   providing the secured device of claim 1,
   storing said information or data in said phase-change element of said secured device, and
   transforming said security element to said ON state.

* * * * *